(12) United States Patent
Kong et al.

(10) Patent No.: US 8,022,415 B2
(45) Date of Patent: Sep. 20, 2011

(54) LIGHT EMITTING DEVICE PACKAGE AND LIGHT UNIT HAVING THE SAME

(75) Inventors: Sung Min Kong, Gwangju (KR); Choong Youl Kim, Gwangju (KR); Hee Seok Choi, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/947,645

(22) Filed: Nov. 16, 2010

(65) Prior Publication Data

US 2011/0133240 A1    Jun. 9, 2011

Related U.S. Application Data

(63) Continuation of application No. 12/530,637, filed as application No. PCT/KR2008/002183 on Apr. 17, 2008, now Pat. No. 7,858,993.

(30) Foreign Application Priority Data

Apr. 19, 2007 (KR) .................. 10-2007-0038279

(51) Int. Cl.
*H01L 27/15* (2006.01)
*H01L 29/267* (2006.01)
*H01L 31/12* (2006.01)
*H01L 33/00* (2006.01)

(52) U.S. Cl. .............. 257/81; 257/88; 257/98; 257/99

(58) Field of Classification Search .......... 257/81, 257/88, 98, 99, 678
See application file for complete search history.

(56) References Cited

U.S. PATENT DOCUMENTS

| 6,355,946 | B1 | 3/2002 | Ishinaga |
| 2003/0116769 | A1 | 6/2003 | Song et al. |
| 2007/0085107 | A1 | 4/2007 | Nitta et al. |
| 2007/0114555 | A1 | 5/2007 | Takemoto et al. |
| 2008/0142820 | A1 | 6/2008 | Edmond et al. |
| 2009/0261374 | A1 | 10/2009 | Hayashi |
| 2009/0267104 | A1 | 10/2009 | Hsu et al. |
| 2009/0289275 | A1 | 11/2009 | Hayashi |

FOREIGN PATENT DOCUMENTS

| JP | 2000-183407 A | 6/2000 |
| JP | 2002-314142 A | 10/2002 |
| JP | 2004-235139 A | 8/2004 |
| KR | 10-2003-0053853 A | 7/2003 |
| KR | 10-2004-0073869 A | 8/2004 |
| KR | 10-2004-0104178 A | 12/2004 |
| KR | 10-2006-0080339 A | 7/2006 |

OTHER PUBLICATIONS

Full Translation of JP 2000-183407A published Jun. 30, 2000.
Full Translation of JP 2002-314142A published Oct. 25, 2002.
Full Translation of JP 2004-235139A published Aug. 19, 2004.
Full Translation of KR 10-2004-0073869A published Aug. 21, 2004.
Full Translation of KR 10-2004-0104178A published Dec. 10, 2004.
Full Translation of KR 10-2006-0080339A published Jul. 10, 2006.

*Primary Examiner* — Zandra Smith
*Assistant Examiner* — Telly Green
(74) *Attorney, Agent, or Firm* — Birch, Stewart, Kolasch & Birch, LLP

(57) ABSTRACT

Discussed is an LED package The LED package includes a body having a cavity at one side thereof, at least one of lead frames having a bottom frame and a sidewall frame in the cavity, and a light emitting device electrically connected with the lead frames.

5 Claims, 3 Drawing Sheets

[Fig. 1]
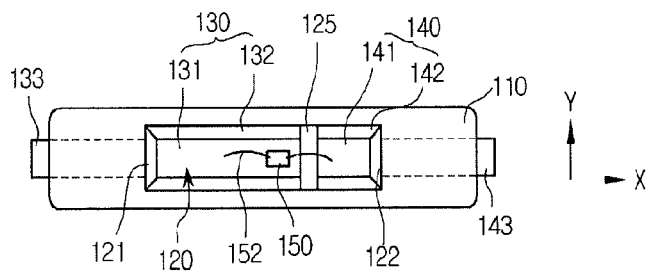
[Fig. 2]
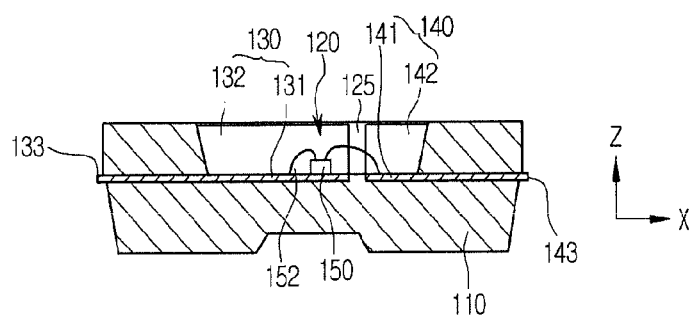
[Fig. 3]
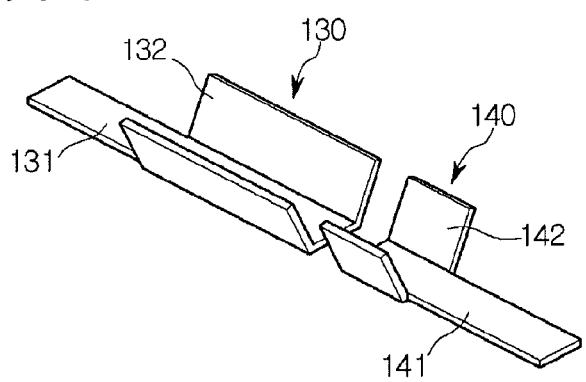
[Fig. 4]
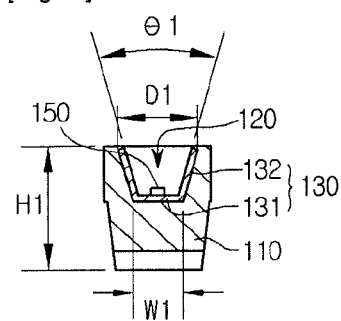

[Fig. 5]
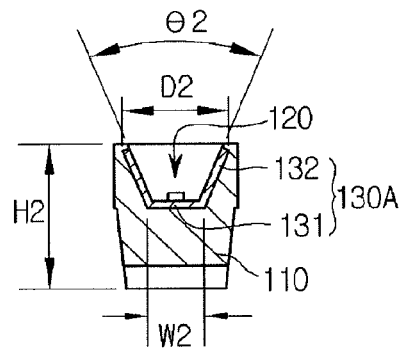
[Fig. 6]
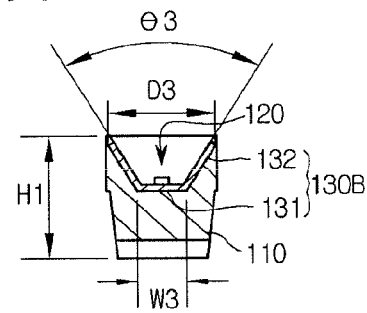
[Fig. 7]
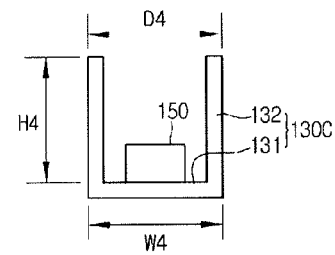
[Fig. 8]
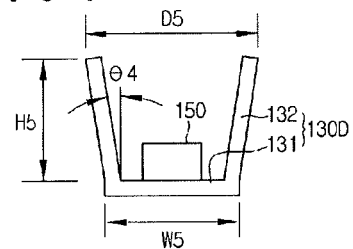
[Fig. 9]
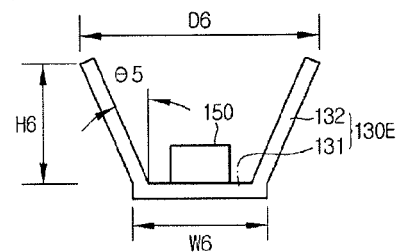

[Fig. 10]
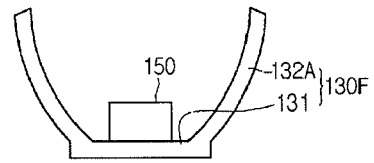
[Fig. 11]
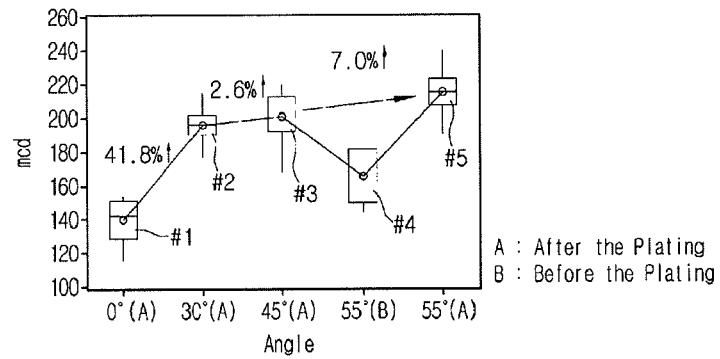
[Fig. 12]
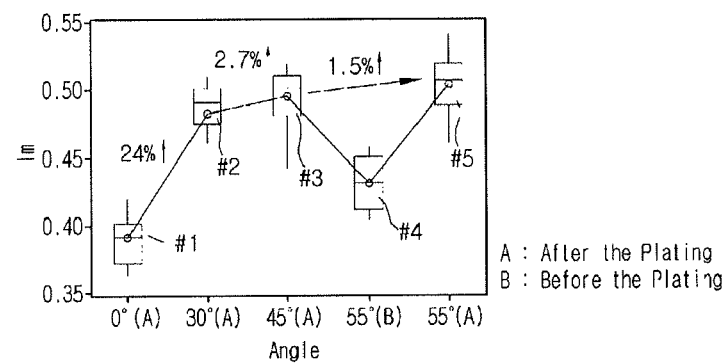
[Fig. 13]
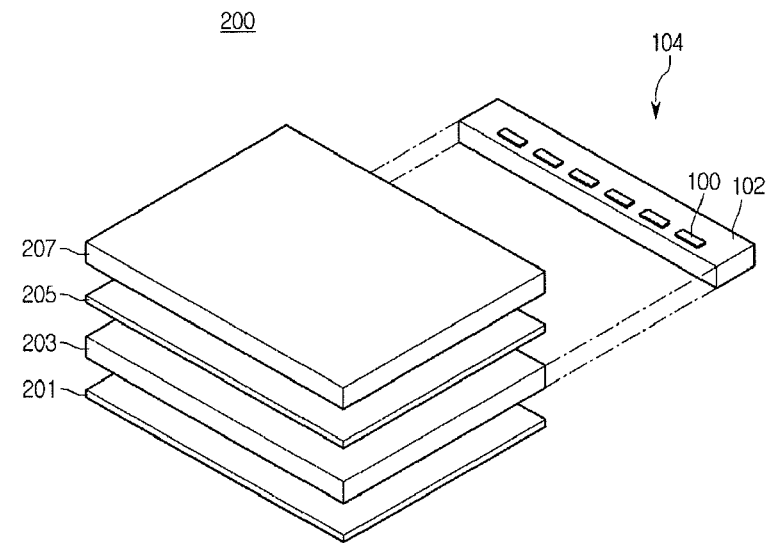

LIGHT EMITTING DEVICE PACKAGE AND LIGHT UNIT HAVING THE SAME

This application is a Continuation of application Ser. No. 12/530,637 filed on Sep. 10, 2009, now U.S. Pat. No. 7,858,993, which is the national phase of PCT International Application No. PCT/KR2008/002183 filed on Apr. 17, 2008, and which claims priority to Application No. 10-2007-0038279 filed in the Republic of Korea on Apr. 19, 2007. The entire contents of all of the above applications is hereby incorporated by reference.

TECHNICAL FIELD

The embodiment relates to an LED (light emitting device) package and a light unit having the same.

BACKGROUND ART

An LED constitutes a light emission source by using GaAs, AlGaAs, GaN, InGaN and InGaAlP-based compound semiconductor materials, thereby producing various colors.

Such characteristics of the LED can be determined by materials, colon, brightness and a brightness range of a compound semiconductor. Further, the LED is provided as a package and is applied to various fields comprising lighting indicators for displaying colors, character indicators, image indicators and the like.

DISCLOSURE OF INVENTION

Technical Problem

The embodiment provides an LED package, in which a lead frame bent in a multi-step is disposed at a bottom surface and at least one sidewall defining a cavity, and a light unit having the same.

The embodiment provides an LED package, in which at least one of plural lead frames is formed at a bottom surface and both sidewalls defining a cavity, and a light unit having the same.

The embodiment provides an LED package comprising a lead frame, which has sidewalls inclined at a predetermined angle or bent with a predetermined curvature, and a light unit having the same.

Technical Solution

An embodiment provides an LED package comprising; a body comprising a cavity at one side thereof; at least one of lead frames comprising a bottom frame and a sidewall frame in the cavity; and a light emitting device electrically connected with the lead frames.

An embodiment provides an LED package comprising; a body comprising a cavity; a fast lead frame comprising a bottom frame and at least one sidewall frame at a fast side of the cavity; a second lead frame comprising a bottom frame at a second side of the cavity; and a light emitting device electrically connected with the first and second lead frames.

An embodiment provides a light unit comprising; a light emitting apparatus comprising a plurality of LED packages; an optical guide plate disposed at one side of the light emitting device; and an optical member disposed above and/or below the optical guide plate, wherein the LED package comprises a body comprising a cavity; at least one of lead frames comprising bottom frame and a sidewall frame in the cavity; and a light emitting device electrically connected with the lead frames.

Advantageous Effects

The embodiment can reduce optical loss in a cavity of an LED package.

The embodiment can improve the light intensity at a center area in a cavity of an LED package.

The embodiment can increase the amount of reflected light in a cavity of an LED package by using a lead frame plated with reflective metal or reflective material.

The embodiment can improve thermal resistance and thermal characteristics of a lead frame of an LED package.

BRIEF DESCRIPTION OF THE DRAWINGS

FIG. 1 is a front view showing an LED package according to an embodiment;

FIG. 2 is a sectional view taken along an X axis of an LED package shown in FIG. 1;

FIG. 3 is a perspective view showing the lead frame of FIG. 1

FIG. 4 is a sectional view taken along a Y axis of the LED package shown in FIG. 1;

FIG. 5 is a sectional view showing an LED package having a lead frame modified according to a first example embodiment;

FIG. 6 is a sectional view showing an LED package having a lead frame modified according to a second example embodiment;

FIGS. 7 to 10 are views showing lead frames modified according to third to sixth example embodiments;

FIG. 11 is a graph showing an angle of a lead frame as a function of light intensity before and after the plating in the LED package of FIG. 4;

FIG. 12 is a graph showing an angle of a lead frame as a function of light velocity (or light amount) before and after the plating in the LED package of FIG. 4; and FIG. 13 is a perspective view showing a display device using the LED package of FIG. 1.

BEST MODE FOR CARRYING OUT THE INVENTION

Hereinafter, an LED package according to an embodiment will be described with reference to the accompanying drawings.

FIG. 1 is a front view showing an LED package according to a first embodiment, FIG. 2 is a sectional view taken along an X axis of the LED package shown in FIG. 1, and FIG. 3 is a perspective view showing the lead frame of FIG. 1.

Referring to FIGS. 1 and 2, the LED package 100 comprises a polygonal shape, such as a rectangular parallelepiped shape or a regular hexahedral shape, and is classified into a side emission type LED package and a top emission type LED package. Further, the LED package 100 can be used as a light source for a backlight unit of an LCD or as a light unit in an illumination field. Hereinafter, a side emission type LED package will be described for convenience of decryption.

The LED package comprises a body 110 comprising a cavity 120, lead frames 130 and 140, and a light emitting device 150.

The body 110 comprises one selected from the group consisting of PPA (polyphthalamid), PA9T (polyamid9T), liquid crystal polymer and SPS (syndiotactic polystyrene).

The body 110 is formed therein with the cavity 120 comprising a predetermined depth. When a first direction is referred to as an X axis and a second direction is referred to as a Y axis, the length of the body 110 in the X axis direction may be greater than the width of the body 110 in the Y axis direction. However, the scope of the present invention is not limited thereto.

The lead frames 130 and 140 are formed at the upper portion of the body 110 through injection molding. A part of the lead frames 130 and 140 is exposed to the cavity 120 of the body 110.

Referring to FIGS. 1 to 3, the lead frames 130 and 140 comprises bottom frames 131 and 141 and sidewall frames 132 and 142 in the cavity 120, respectively. One end of the bottom frame 131 and one end of the bottom frame 141 may serve as external electrodes 133 and 143 by passing through the body 110 in the X axis direction, respectively. The sidewall frames 132 and 142 are inclined outward from the Y axis, which is perpendicular to the bottom frames 131 and 141, at a predetermined angle. The external electrodes 133 and 143 can be provided by one of the bottom frames 131 and 141 and the sidewall frames 132 and 142.

The lead frames 130 and 140 are formed through injection molding using high reflective metals comprising one selected from the group consisting of Fe, Sn, Cr, Zn, Ni, Al, Ag, Au, Cu, and an alloy thereof.

One of the lead frames 130 and 140, for instance, the lead frame 130 may have a substantially "C" shape in which three sides are bent at a predetermined angle, and the other one of the lead frames 130 and 140, for instance, the lead frame 140 may form the bottom frame 141. Further, at least one of the lead frames 130 and 140, for instance, the lead frame 130 can comprise the bottom frame 131 and at least one of the sidewall frames 132. According to the embodiment, the lead frames 130 and 140 may have shapes different from each other. However, the scope of the present invention is not limited thereto.

The lead frames 130 and 140 are integrally formed in the cavity 120 and may have lengths different from each other. Further, the lead frames 130 and 140 can be formed with a thickness of 20 μm to 300 μm.

A partition 125 serving as a part of the body 110 is formed between the lead frames 130 and 140 to structurally separate the lead frame 130 from the lead frame 140. Thus, the lead frames 130 and 140 serve as electrodes and reflect light.

Both sides (i.e. left and right sides 121 and 122) defining the cavity 120 in the X direction are inclined at a predetermined angle and serve as a part of the body 110. The partition 125 and the left and right sides 121 and 122, which are disposed in the cavity 120, can be formed together with the cavity 120 when the body 110 is formed.

The light emitting device 150 is attached to at least one of the lead frames 130 and 140 in the cavity 120, and is connected with the lead frames 130 and 140 through a wire 152. The light emitting device 150 can be mounted on the lead frames 130 and 140 through wire bonding, flip bonding, die bonding and the like.

Further, the light emitting device 150 is a III-V group compound semiconductor and comprises one of AlGaN, GaN, InGaAlP and GaAs-based LED chips. Further, a protective device such as a Zener diode can be mounted on the lead frames 130 and 140 in order to protect the light emitting device 150.

Meanwhile, the LED package 100 can be prepared in the form of a white light emitting device using a blue LED chip and a yellow fluorescent substance (e.g. silicate-based fluorescent substance), orange fluorescent substance, green fluorescent substance, and red fluorescent substance. Further, the LED package 100 can be prepared in the form of a light source by combining at least one of a red LED chip, a green LED chip, a blue LED chip, a yellow LED chip, a yellow green LED chip and an UV LED chip.

In addition, a resin member (not shown) can be molded in the cavity 120 in order to protect the light emitting device 150. The resin member can use epoxy or silicon having transparent material. If the situation requires, fluorescent substance powder can also be added to the resin member and molded in the cavity 120. Molding solution or additive can be used with the resin member according to the use purpose and environment, and the characteristics of a product. However, the embodiment is not limited thereto. Further, the surface of the resin member has one of a flat shape, a concave lens shape and a convex lens shape.

FIG. 4 is a sectional view taken along a Y axis of the LED package shown in FIG. 1. Hereinafter, the lead frame 130 of the lead frames 130 and 140 will be described as an example. However, it should be noted that the lead frames may not be formed under the same conditions as will be described later.

Referring to FIG. 4, the body 110 has a predetermined height H1, e.g. maximum 1 mm. For instance, the sidewall frames 132 of the lead frame 130 has an internal angle θ1 of 30° Further, the sidewall frames 132 can be inclined at the same angle (e.g. 15°) or at different angles with respect to the axis perpendicular to the bottom frame 131 of the lead frame 130.

The interval D1 between the sidewall frames 132 may vary according to the internal angle θ1 between the sidewall frames 132 of the lead frame 130. For instance, the bottom frame 131 of the lead frame 130 has a width W1 of 300 μm to 310 μm.

FIG. 5 is a sectional view showing the LED package comprising a lead frame modified according to a first example embodiment. In describing the above first example embodiment about the lead frame, the same reference numerals are used to designate the same elements of FIG. 4, and a detailed description will be omitted in order to avoid redundancy.

Referring FIG. 5, the height H2 of the body 110 and the width W2 of the bottom frame 131 may be identical to or different from those of FIG. 4, respectively. For instance, an internal angle θ2 between the sidewall frames 132 of a lead frame 130A is 45° Each sidewall frame 132 can be inclined at an angle of 22.5° with respect to the axis perpendicular to the bottom frame 131. As the internal angle θ2 between the sidewall frames 132 of the lead frame 130A is increased, an interval D2 (D2>D1) between the sidewall frames 132 can be further widened. The interval D2 between the sidewall frames 132 is widened, so that the surface width of the cavity 120 can be increased.

FIG. 6 is a sectional view showing the LED package comprising a lead frame modified according to a second example embodiment. In describing the second example embodiment about the lead frame, the same reference numerals are used to designate the same elements of FIG. 4, and a detailed description will be omitted in order to avoid redundancy.

Referring to FIG. 6, the height H1 of the body 110 and the width W3 of the bottom frame 131 may be identical to or different from those of FIG. 4, respectively. For instance, an internal angle θ3 between the sidewall frames 132 of a lead frame 130B is 60° Each sidewall frame 132 can be inclined at an angle of 30° with respect to the axis perpendicular to the bottom frame 131. As the internal angle θ3 between the sidewall frames 132 of the lead frame 130B is increased, an interval D3 (D3>D2>D1) between the sidewall frames 132 can be further widened.

FIGS. 7 to 10 are views showing lead frames modified according to third to sixth example embodiments.

Referring to FIG. 7, the lead frame 130C comprises the bottom frame 131 and sidewall frames 132 bent from the bottom frame 131 at a right angle. In such a case, a width W4 of the bottom frame 131 and an interval D4 between the sidewall frames 132 are 420 µm, and a cavity depth H4 of the lead frame 130C is 300 µm to 450 µm.

Referring to FIG. 8, the lead frame 130D comprises the bottom frame 131 and one sidewall frame 132 inclined at an angle $\theta 4$ of 15° with respect to the axis perpendicular to the bottom frame 131. In such a case, a cavity depth H5 of the lead frame 130D is 338 µm to 386 µm and an interval D5 between the sidewall frames 132 is 600 µm to 626 µm. For instance, a width W5 of the bottom frame 131 is 420 µm.

Referring FIG. 9, the lead frame 130E comprises the bottom frame 131 and one sidewall frame 132 inclined at an angle $\theta 5$ of 30° with respect to the axis perpendicular to the bottom frame 131. In such a case, a cavity depth H6 of the lead frame 130E is 303 µm to 346 µm and an interval D6 between the sidewall frames 132 is 770 µm to 850 µm. A width W6 of the bottom frame 131 is about 420 µm to 450 µm.

Referring to FIG. 10, the lead frame 130F comprises the bottom frame 131 and sidewall frames 132A inclined at a predetermined angle with respect to the axis perpendicular to the bottom frame 131 while being bent with a predetermined curvature. In detail, the sidewall frames 132A are inclined at the predetermined angle and have a hemispherical shape to efficiently reflect light.

According to the lead frames as described above, when one sidewall frame 132 has an inclination angle of 15° to 30° with respect to the bottom frame, the cavity depth is 250 µm to 700 µm, and the interval between the sidewall frames 600 µm to 850 µm, the highest efficiency is obtained. Further, the lead frame, which has high reflective metal or is plated with high reflective metal material, has a reflectivity of 95% or more, and has improved thermal resistance and thermal characteristics. Further, the inclined sidewall frame can improve the light intensity at the center area.

FIG. 11 is a graph showing an angle of the lead frame as a function of light intensity before and after the plating in the LED package of FIG. 4, and FIG. 12 is a graph showing an angle of the lead frame as a function of light velocity (or light amount) before and after the plating in the LED package of FIG. 4. The box plot shown in FIGS. 11 and 12 is obtained using a blue LED having a specification of the same light intensity and the same light velocity. Further, the intensity of light and the velocity of light are measured using the same measurement specimen.

Referring to FIGS. 11 and 12, in the LED package of FIG. 4, the intensities of light of first to fifth LED packages #1 to #5 are measured by changing the internal angle $\theta 1$ of the lead frame. The first, second, third and fifth LED packages #1, #2, #3 and #5 comprise a lead frame, which is subject to Ag-plating after the bending and punching processes (see A). The fourth LED package #4 comprises a lead frame, which is subject to Ag-plating before the bending and punching processes (see B).

Further, the internal angles of the lead frames of the first to fifth LED packages #1 to #5 are 0°, 30°, 45°, 55°, and 55°, respectively.

FIG. 11 is a graph showing the angle of the lead frame as a function of the light intensity of the LED package, and Table 1 below shows the result.

TABLE 1

| | Lv(mcd) | | | | |
|---|---|---|---|---|---|
| | #1 | #2 | #3 | #4 | #5 |
| AVG | 138.9 | 197.0 | 202.2 | 166.5 | 216.3 |
| MIN | 114.0 | 177.9 | 168.1 | 143.4 | 190.8 |
| MAX | 154.1 | 215.4 | 221.5 | 183.1 | 243.6 |

As shown in FIG. 11 and Table 1, the difference of 1 cd (=1000 mcd) is generated according to the angle of the lead frame, after the plating A, and before the plating B. The second LED package #2 has an internal angle greater than that of the first LED package #1 by 30°, and has a light intensity increased by 41.8%. The third LED package #3 has an internal angle greater than that of the second LED package #2 by 15°, and has a light intensity increased by 2.6%. Further, the fifth LED package #5 has an internal angle greater than that of the third LED package #3 by 10°, and has a light intensity increased by 7.0%.

FIG. 12 is a graph showing the angle of the lead frame as a function of the lumen of the LED package, and Table 2 below shows the result.

TABLE 2

| | Lm | | | | |
|---|---|---|---|---|---|
| | #1 | #2 | #3 | #4 | #5 |
| AVG | 0.389 | 0.482 | 0.495 | 0.431 | 0.503 |
| MIN | 0.360 | 0.410 | 0.440 | 0.400 | 0.460 |
| MAX | 0.420 | 0.510 | 0.520 | 0.460 | 0.540 |

As shown in FIG. 12 and Table 2, the difference of lumen is generated according to the angle of the lead frame, after the plating A, and before the plating B. The second, third and fifth LED packages have a light velocity increased by 24%, 26.7% (=24%+2.7%) and 28.2% (=24%+2.7%+1.5%) when the internal angle of the lead frame is increased by 30°, 45°, and 55°, respectively.

Referring to FIGS. 11 and 12, the fourth LED package #4 has the pre-plated lead frame and the fifth LED package #5 has the post-plated lead frame. At this time, the fourth and fifth LED packages #4 and #5 have the same internal angles. However, since the lead frame of the fourth LED package #4 is subject to Ag-plating before the bending and punching processes, the Ag plating surface is damaged when bending the lead frame. Thus, the optical efficiency deteriorates.

Accordingly, the LED package shows the optimal light intensity when the lead frame has an internal angle of 30° to 55°. Further, the post plating scheme exhibits optical efficiency higher than the pre-plating scheme. Furthermore, the surface of the lead frame is plated with high reflective metal or high reflective material, so that the lead frame has a reflectivity of 95% or more, and improved thermal resistance and thermal characteristics. In addition, the light intensity at the center area can be improved by the inclined sidewall frames.

Such a LED package can be applied to an indication field, a display field and the like, and can be provided to a terminal together with a display device.

FIG. 13 is a perspective view showing a display device using the LED package according to the embodiment.

Referring to FIG. 13, the display device 200 comprises a light emitting apparatus 104 comprising a plurality of LED packages 100, a reflective plate 201, a light guide plate 203, an optical sheet 205 and a display panel 207.

The light emitting apparatus 104 comprises the LED packages 100 mounted on a substrate 102. As shown in FIGS. 1 to 3, in the LED package 100, a plurality of lead frames have a structure in which the bottom frames are integrally formed with the sidewall frames thereof while the sidewall frames are being bent from the bottom frames, or can be prepared in the form of the aforementioned example embodiments.

Such a light emitting apparatus 104 corresponds to at least one side of the light guide plate 203, and light emitted from the light emitting apparatus 104 is incident into a lateral side of the light guide plate 203.

The light guide plate 203 guides the incident light over the whole area of the display device 200 and then outputs the light as surface light. Further, a reflective pattern (not shown) can be formed at one side of the light guide plate 203.

The reflective plate 201 is disposed below the light guide plate 203 to reflect light leaked through the light guide plate 203.

The light emitted from the light guide plate 203 is irradiated onto the display panel 207 through the optical sheet 205. The optical sheet 205 comprises at least one of a diffusion sheet (not shown), a horizontal prism sheet (not shown) and a vertical prism sheet (not shown). The diffusion sheet is disposed on the light guide plate 203 to diffuse the incident light. The horizontal and vertical prism sheets are disposed on the diffusion sheet to guide the diffused light toward a display area.

The light emitting apparatus 104, the light guide plate 203 and the optical sheet 205 can be defined as a light unit. The light unit may comprise the reflective plate 201. Further, a part of the elements of the light unit can be received in a structure (not shown) such as a mold frame, a chassis structure or a metal bottom cover.

The display panel 207 serving as a liquid crystal panel comprises two transparent substrates (not shown) and a liquid crystal, and can display information by transmitted light and driving of the liquid crystal. The embodiment is not limited to such a display panel 207. Further, a display panel can be disposed at both sides of the light guide plate 203.

Such a display device 200 can be applied to a portable terminal such as a cell phone or a PMP, or a computer.

Although embodiments have been described with reference to a number of illustrative embodiments thereof, it should be understood that numerous other modifications and embodiments can be devised by those skilled in the art that will fall within the spirit and scope of the principles of this disclosure.

INDUSTRIAL APPLICABILITY

The embodiment can reduce optical loss in a cavity of an LED package.

The embodiment can improve the light intensity at a center area in a cavity of an LED package.

The embodiment can increase the amount of reflected light in a cavity of an LED package by using a lead frame plated with reflective metal or reflective material.

The embodiment can improve thermal resistance and thermal characteristics of a lead frame of an LED package.

The invention claimed is:

1. A light emitting diode package comprising:
   a package body having a cavity;
   a light emitting diode mounted in the package body; and
   a lead frame disposed in the package body, the lead frame comprising a plane surface electrically coupled to the light emitting diode in the cavity of the package body, and at least two lateral sidewall surfaces extending from the plane surface in the same direction as light from the light emitting diode emits,
   wherein the cavity of the package body has an inner sidewall inclined from the plane surface of the lead frame,
   wherein the package body has a partition to split up the lead frame,
   wherein the plane surface of the lead frame is extended to the outer surface of the package body so as to function as an electrode,
   wherein the height of the lateral sidewall surfaces is in the range of 250 μm to 700 μm, and
   wherein the distance between the uppermost portions of the lateral sidewall surfaces is in the range of 420 μm to 850 μm.

2. The light emitting diode package according to claim 1, wherein the inclination angle of the lateral sidewall surface with respect to the imaginary axis perpendicular to the plane surface of the lead frame is in the range of 15 to 30 degrees.

3. The light emitting diode package according to claim 1, wherein the shapes of the split lead frames in the cavity are different from each other.

4. The light emitting diode package according to claim 1, wherein the inner surface of the lateral sidewall surfaces is exposed toward the cavity.

5. The light emitting diode package according to claim 1, wherein the lateral sidewall surfaces are embedded in the inclined inner sidewall of the cavity.

* * * * *